(12) United States Patent
Zielbauer

(10) Patent No.: US 6,940,115 B2
(45) Date of Patent: Sep. 6, 2005

(54) MEMORY CELL HAVING A SECOND TRANSISTOR FOR HOLDING A CHARGE VALUE

(75) Inventor: Jürgen Zielbauer, München (DE)

(73) Assignee: Infineon Technologies AG, Munich (DE)

(*) Notice: Subject to any disclaimer, the term of this patent is extended or adjusted under 35 U.S.C. 154(b) by 15 days.

(21) Appl. No.: 10/194,877

(22) Filed: Jul. 12, 2002

(65) Prior Publication Data

US 2003/0015749 A1 Jan. 23, 2003

(30) Foreign Application Priority Data

Jul. 12, 2001 (DE) .......................... 101 33 874

(51) Int. Cl.⁷ .......................... H01L 27/108
(52) U.S. Cl. .......................... 257/301
(58) Field of Search .......................... 257/301, 302, 257/304, 296, 298

(56) References Cited

U.S. PATENT DOCUMENTS

| 4,794,434 A | * | 12/1988 | Pelley, III | .................... 257/301 |
| 5,041,887 A | * | 8/1991 | Kumagai et al. | ........... 257/303 |
| 5,198,995 A | * | 3/1993 | Dennard et al. | ............ 365/149 |
| 5,598,367 A | * | 1/1997 | Noble | ........................ 365/149 |

FOREIGN PATENT DOCUMENTS

| EP | 0 550 894 A1 | 7/1993 |
| EP | 0 822 599 A2 | 2/1998 |

* cited by examiner

*Primary Examiner*—Jack Chen
(74) *Attorney, Agent, or Firm*—Laurence A. Greenberg; Werner H. Stemer; Ralph E. Locher

(57) ABSTRACT

A memory cell has a transistor, a capacitor, and a second transistor that is formed as a parasitic field-effect transistor. The parasitic field-effect transistor is provided in order to produce an electrically conductive connection between a voltage source and the inner electrode of the capacitor. Stabilization of a charge state of the capacitor is automatically achieved in this way.

7 Claims, 1 Drawing Sheet

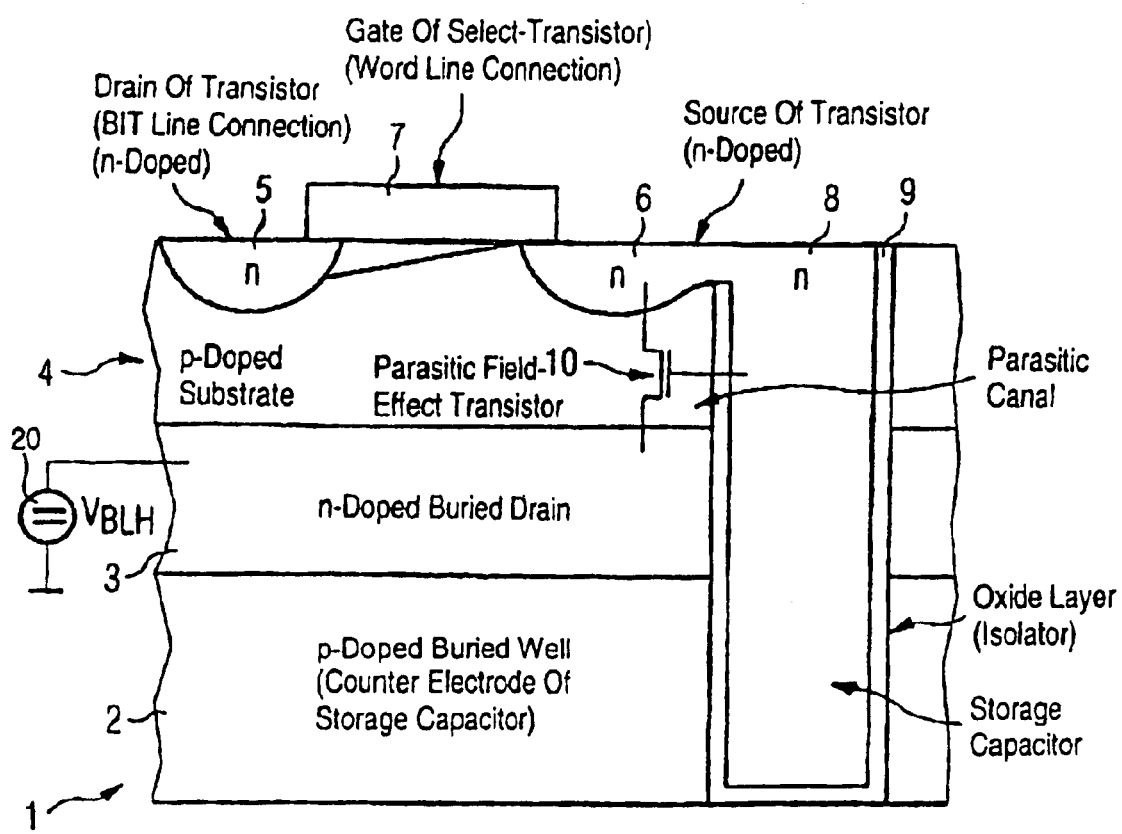

MEMORY CELL HAVING A SECOND TRANSISTOR FOR HOLDING A CHARGE VALUE

BACKGROUND OF THE INVENTION

FIELD OF THE INVENTION

The invention relates to a memory cell having a transistor for reading and/or writing an information item from/to a capacitor.

Memory cells are used in semiconductor memory components in order to store information. The memory cell has a transistor and a capacitor. The information being stored is represented by the charge state of the capacitor. In particular, memory cells having a transistor and a capacitor are used in dynamic semiconductor memory components. On account of unavoidable leakage currents, however, charge is lost from the capacitor. If the leakage currents are too large, then the information stored on the basis of the charge in the memory cell can be lost. In order to avoid this problem, the memory cells are checked to insure that they correctly function.

If memory cells have high leakage currents, then these memory cells are identified during the functionality check of the semiconductor memory component and are replaced by redundant memory cells. Furthermore, it is known, in the case of static semiconductor memory components, to store information using the switching state of a transistor pair. One of the two transistors in each case stabilizes the switching state of the other transistor, so that the information is not stored by charge and so the problem of leakage currents does not occur.

Although the static storage of information using the switching state of the transistor pair has the advantage that the information is maintained for as long as the voltage supply of the semiconductor memory component is maintained, it nonetheless has the disadvantage that a static memory cell requires four to six transistors and hence an area requirement many times larger than a memory cell in which the information is stored by the charge state of the capacitor.

SUMMARY OF THE INVENTION

It is accordingly an object of the invention to provide a memory cell which overcomes the above-mentioned disadvantages of the prior art apparatus of this general type.

In particular, it is an object of the invention to provide a memory cell that has smaller leakage currents.

With the foregoing and others objects in view there is provided, in accordance with the invention, a memory cell, including: semiconductor material; a capacitor formed in the semiconductor material and having an inner electrode and an outer electrode; a first transistor for reading an information item from the capacitor and writing an information item to the capacitor; an insulating layer electrically insulating the inner electrode from the outer electrode; and a second transistor formed in the semiconductor material. The second transistor has a first contact region that is electrically conductively connected to the inner electrode. The second transistor has a control contact region that is formed by the inner electrode of the capacitor. The second transistor has a second contact region that is provided for connecting to a voltage source. The second transistor enables the capacitor to be charged.

In accordance with an added feature of the invention, a first electrically conductive region is formed in the semiconductor material, and the first conductive region constitutes the outer electrode of the capacitor. Further, a second conductive region is formed in the semiconductor material. The insulating layer electrically insulates the inner electrode of the capacitor from the semiconductor material. The first conductive region adjoins the insulating layer. The first contact region of the second transistor is formed in the semiconductor material. The first contact region of the second transistor is conductively connected to the inner electrode. The first contact region is formed at a predetermined distance from the first conductive region formed in the semiconductor material. The semiconductor material has a given doping. The first contact region, the inner electrode and the second region have an inverse doping with respect to the given doping of the semiconductor material. The first contact region and the first conductive region adjoin the insulating layer. The second conductive region adjoins the insulating layer. The first conductive region has the given doping, i.e. the same doping as the semiconductor material. The second conductive region is formed between the first contact region and the first conductive region. The second contact region of the second transistor is formed by the second conductive region.

In accordance with an additional feature of the invention, the insulating layer has a region between the first conductive region and the first contact region. This region of the insulating layer has a thickness. The second conductive region has a thickness. The first contact region and the second conductive region define an intermediate region therebetween, and the intermediate region has a thickness. The thickness of the region of the insulating layer is equal to either the thickness of the second conductive region and/or the thickness of the intermediate region.

In accordance with another feature of the invention, a first conductive region is formed from a positively doped semiconductor material. The inner electrode, the first contact region, and the second contact region are formed from a negatively doped semiconductor material. The semiconductor material is positively doped.

An essential advantage of the memory cell is that a second transistor is provided which, depending on the charge state of the capacitor, conductively connects the inner electrode of the capacitor to a voltage source. What is achieved in this way is that a charge state of the capacitor is automatically stabilized. In this case, a parasitic field-effect transistor is skillfully used and the implantation strategy is modified to compensate for a mechanism that usually contributes to the charge carrier loss of the capacitor. This mechanism is used to stabilize the charge state of the capacitor.

Active stabilization of a desired charge state of the capacitor is achieved by forming the memory cell in accordance with the invention. By virtue of the advantageous embodiment of the memory cell, it is possible to produce semiconductor memory components with lower production losses. At the same time a smaller area is required to implement the additional redundant memory cells on the component. A saving of area and consequently, a reduction of costs are thus achieved.

Moreover, the memory cell has a lower probability of failure, so that overall a dynamic semiconductor memory component constructed with the inventive memory cell has greater reliability.

The inventive memory cell is preferably formed with a trench capacitor. Moreover, depending on the dopings used, it is possible to effect stabilization of a positive or negative charge within the capacitor electrode.

The second transistor is preferably constituted by an npn layer sequence which is formed adjoining the insulating layer of the capacitor. Instead of the npn layer sequence, it is also possible to use a pnp layer sequence if the inner electrode of the capacitor has a p-doping instead of an n-type doping. A simple design for forming the inventive memory cell is possible in this way.

In a preferred embodiment of the memory cell, the insulating layer of the capacitor has the same thickness essentially over the entire pnp or npn layer sequence. This affords a simple and cost-effective embodiment of capacitor.

Other features which are considered as characteristic for the invention are set forth in the appended claims.

Although the invention is illustrated and described herein as embodied in a memory cell having a second transistor for holding a charge value, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The sole drawing FIGURE diagrammatically shows a cross section through a memory cell of a dynamic semiconductor memory component.

DESCRIPTION OF THE PREFERRED EMBODIMENTS

Referring now to the drawing FIGURE in detail, there is shown a dynamic semiconductor memory component. A semiconductor substrate 1 is illustrated which has a first doping layer 2. The substrate 1 is formed as a silicone substrate and the first doping layer 2 constitutes a positively doped buried well. A second doping layer 3 is applied on the first doping layer 2. The second doping layer 3 constitutes an N-doped buried well. Arranged above the second doping layer 3 is a third doping layer 4, which is formed as a positively doped substrate layer. A first negatively doped contact region 5 is introduced into the third doping layer 4 from the surface. The first contact region 5 constitutes a drain contact of a transistor and is used for the connection of a bit line. At a predetermined distance from the first contact region 5, a second contact region 6 is formed in the third doping layer 4 in the form of a negatively doped region. Between the first and second contact regions 5, 6, a gate contact 7 serving for the connection of a word line is formed on the surface of the substrate 1. The transistor, constitutes a selection transistor.

A negatively doped inner electrode 8 of a trench capacitor is arranged adjoining the second contact region 6. The inner electrode 8 is conductively connected to the second contact region 6. The inner electrode 8 is surrounded by an insulating layer 9, which electrically insulates the inner electrode 8 from the surrounding material. Only a conductive connection to the second contact region 2 is formed. The inner electrode 8 extends, proceeding from the surface of the substrate 1, via the third 4 and second 3 doping layers right into the first doping layer 2. In a simple embodiment, the insulating layer 9 is formed as a silicone oxide layer.

The insulating layer 9 is preferably formed adjoining the first, second and third doping layers 2, 3, 4 in a virtually constant thickness. A simple formation of the trench capacitor is possible in this way.

The first doping layer 2 constitutes a counterelectrode of the trench capacitor. The second doping layer 3 is electrically conductively connected to a voltage source 20.

A parasitic field-effect transistor 10 is formed between the second contact region 6, which constitutes a source contact of the transistor, and the second doping layer 3. The inner electrode 8 of the trench capacitor constitutes the control contact of the field-effect transistor. The two contacts of the parasitic field-effect transistor are constituted by the second contact region 6 and the second doping layer 3.

In contrast to previous embodiments of capacitors, the capacitor according to the invention is formed with a relatively thin insulating layer 9 in the region of the p-doped substrate 4 that constitutes the third doping layer. In this way, the control function is supported by the inner electrode 8, in contrast to previously known embodiments in which the formation of the parasitic field-effect transistor was disadvantageous. Previously known embodiments have an insulating layer 9 with a larger thickness in the region of the parasitic field-effect transistor, in order to avoid the effect of the parasitic field-effect transistor.

In contrast thereto, however, in the inventive memory cell embodiment, the formed parasitic field-effect transistor is used in order to make a conductive connection between the voltage source 20 and the inner electrode 8, for a given charge state of the inner electrode 8. This ensures that, for a given charge level, the inner electrode 8 is connected to the voltage source 20 and is supplied with charge. As a result, the charge state of the capacitor is automatically stabilized.

The method of operation of the inventive memory cell is explained below. When the memory cell is formed in accordance with the FIGURE, a stored charge state +1 would typically be jeopardized because of a charge carrier loss. If a +1 is stored in the capacitor, then the high charge level in the inner electrode 8 of the capacitor forms a channel of a parasitic field-effect transistor 10 at the outside of the insulating layer 9 in the region of the third doping layer 4. As a result, the inner electrode 8 of the capacitor is connected to the voltage source 20 via the second doping layer 3 in the manner according to the invention. The voltage source 20 holds the charge level of the inner electrode 8 at the voltage value of the voltage source. Consequently, the stored charge +1 is stabilized with respect to undesirable leakage currents.

By contrast, if a 0, i.e. a negative charge, is stored in the capacitor, then the negative charge in the storage capacitor blocks the parasitic transistor, so that no charge flows away.

Instead of the doping illustrated in the FIGURE, a correspondingly inverse doping is also possible, so that the inner electrode 8, the first and second contact regions 5, 6 and the second doping layer 3 are positively doped. In a corresponding manner, the third doping layer 4 and the first doping layer 2 are then formed in a negatively doped manner.

I claim:

1. A memory cell, comprising:

semiconductor material;

a capacitor formed in said semiconductor material and having an inner electrode and an outer electrode;

a first transistor for performing an operation selected from the group consisting of reading an information item from said capacitor and writing an information item to said capacitor;

an insulating layer electrically insulating said inner electrode from said outer electrode; and a second transistor formed in said semiconductor material;

said second transistor having a first contact region disposed adjoining said inner electrode thereby being directly connected to said inner electrode;

said second transistor having a control contact region formed by said inner electrode of said capacitor;

said second transistor having a second contact region for connecting to a voltage source;

said second transistor enabling charging of said capacitor from a charge provided by the voltage source;

said insulating layer having a region running along said outer electrode, said second contact region, and up towards said first contact region, said region of said insulating layer having a constant thickness allowing said second transistor to go into a conductive state when said inner electrode carries a high logic level.

2. The memory cell according to claim 1, comprising:

a first electrically conductive region formed in said semiconductor material, said first conductive region constituting said outer electrode of said capacitor; and a second conductive region formed in said semiconductor material;

said insulating layer electrically insulating said inner electrode of said capacitor from said semiconductor material;

said first conductive region adjoining said insulating layer;

said first contact region of said second transistor being formed in said semiconductor material;

said first contact region of said second transistor being conductively connected to said inner electrode;

said first contact region being formed at a distance from said first conductive region formed in said semiconductor material;

said semiconductor material having a doping of a first conductivity type;

said first contact region, said inner electrode and said second region having a doping of a second conductivity type being oppositely doped with respect to said doping of said semiconductor material of said first conductivity type;

said first contact region and said first conductive region adjoining said insulating layer;

said second conductive region adjoining said insulating layer;

said first conductive region having the doping of said first conductivity type;

said second conductive region being formed between said first contact region and said first conductive region; and said second contact region of said second transistor being formed by said second conductive region.

3. The memory cell according to claim 1, wherein the voltage source charges said capacitor during the conductive state of said second transistor.

4. The memory cell according to claim 1, wherein the voltage source charges said capacitor during the conductive state of said second transistor for stabilizing a charge on said inner electrode offsetting undesirable leakage currents.

5. The memory cell according to claim 1, wherein said constant thickness of said region of said insulating layer is selected for allowing said second transistor to conduct if a high logic level is impressed on said capacitor.

6. The memory cell according to claim 5, wherein said constant thickness of said region of said insulating layer is selected for allowing said second transistor to be nonconducting if a low logic level is impressed on said capacitor.

7. A memory cell, comprising:

semiconductor material;

a capacitor formed in said semiconductor material and having an inner electrode and an outer electrode;

a first transistor for performing an operation selected from the group consisting of reading an information item from said capacitor and writing an information item to said capacitor;

an insulating layer electrically insulating said inner electrode from said outer electrode;

a first conductive region formed from a positively doped semiconductor material;

a second transistor formed in said semiconductor material;

said second transistor having a first contact region disposed adjoining said inner electrode thereby being directly connected to said inner electrode;

said second transistor having a control contact region formed by said inner electrode of said capacitor;

said second transistor having a second contact region for connecting to a voltage source;

said second transistor enabling charging of said capacitor;

said insulating layer having a region running along said outer electrode, said second contact region, and up towards said first contact region, said region of said insulating layer having a constant thickness;

said inner electrode, said first contact region and said second contact region being formed from a negatively doped semiconductor material; and said semiconductor material being positively doped.

* * * * *